United States Patent [19]
Lacey

[11] 3,931,618
[45] Jan. 6, 1976

[54] HOUSING STRUCTURE AND MAGNETIC BIASING FOR BUBBLE MEMORIES

[75] Inventor: Richard F. Lacey, Palo Alto, Calif.

[73] Assignee: Hewlett-Packard Company, Palo Alto, Calif.

[22] Filed: Nov. 14, 1973

[21] Appl. No.: 415,700

[52] U.S. Cl.. 340/174 S; 340/174 TF; 340/174 PM; 340/174 MA
[51] Int. Cl.² ............. G11C 11/14; G11C 5/04
[58] Field of Search.... 340/174 TF, 174 S, 174 PM, 340/174 MA; 335/302, 284

[56] References Cited
UNITED STATES PATENTS

| | | | |
|---|---|---|---|
| 3,087,131 | 4/1963 | Babcock et al. | 340/174 PM |
| 3,241,126 | 3/1966 | Snyder | 340/174 MC |
| 3,609,611 | 9/1971 | Parnell | 335/302 |
| 3,702,991 | 11/1972 | Bate et al. | 340/174 TF |
| 3,711,841 | 1/1973 | Geusic et al. | 340/174 TF |
| 3,742,471 | 6/1973 | Mikami | 340/174 TF |
| 3,806,903 | 4/1974 | Myer | 340/174 PM |
| 3,836,896 | 9/1974 | Rilkin | 342/174 TF |
| 3,864,671 | 2/1975 | Myer | 340/174 PM |

OTHER PUBLICATIONS

IBM Technical Report "Permanent Magnet. Bias Schemes for Bubble Memory Applications," by Lyons (TR22.1633), pp. 1–12; 5/8/73;

Primary Examiner—Stanley M. Urynowicz, Jr.
Attorney, Agent, or Firm—Ronald E. Grubman

[57] ABSTRACT

A completely enclosed housing of a magnetically permeable material contains a pair of magnetic discs. A magnetic bubble chip mounted in a gap between the magnetic discs is thereby subjected to a d.c. magnetic bias field provided by the discs but is also shielded from the effects of external magnetic fields. The device may be precisely magnetized by applying in succession two external magnetic fields of suitable magnitude, in opposite directions.

1 Claim, 4 Drawing Figures

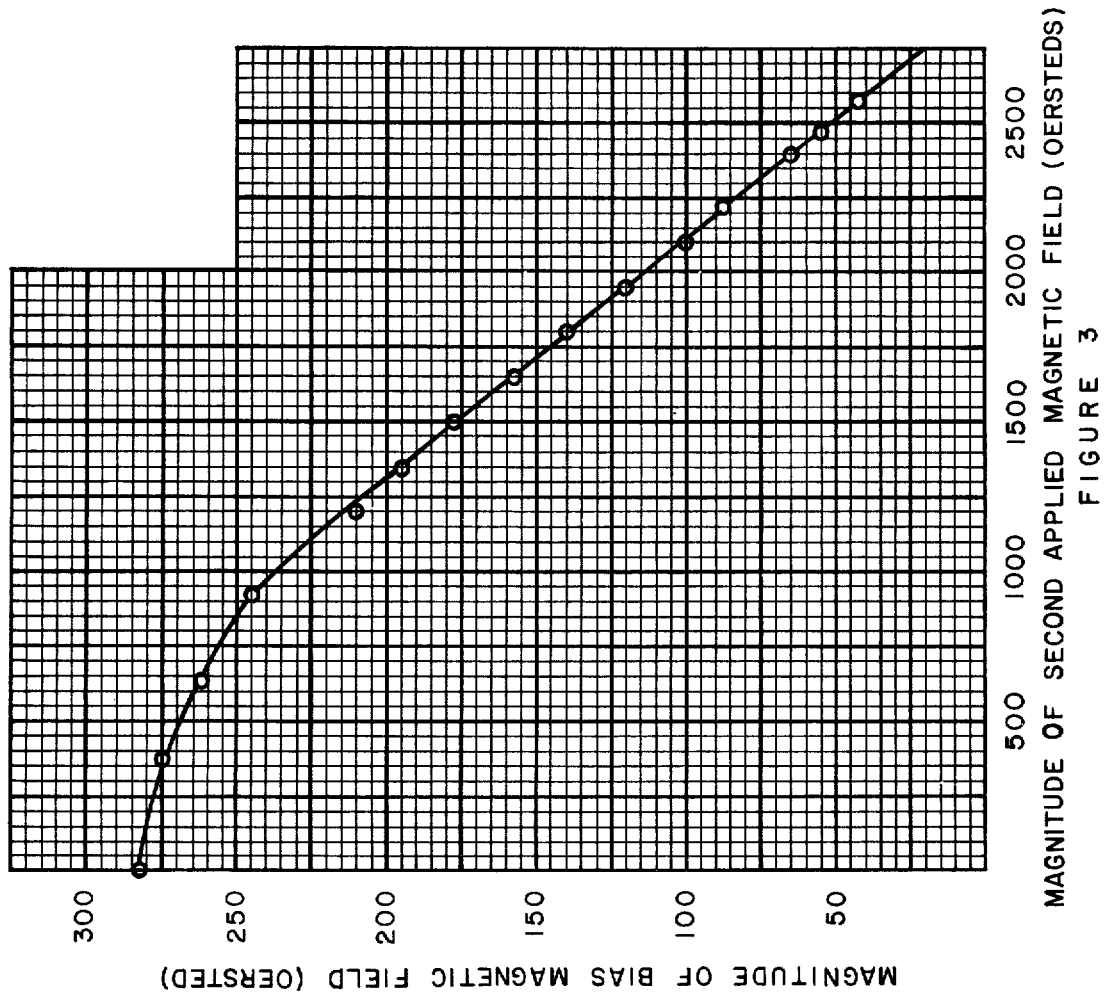

HOUSING STRUCTURE AND MAGNETIC BIASING FOR BUBBLE MEMORIES

BACKGROUND AND SUMMARY OF THE INVENTION

The operation of Magnetic Bubble Memories requires that a d.c. magnetic bias field be applied to each of a number of magnetic bubble memory chips which comprise elements of the memory. It would be desirable to house the chips in a structure which serves both to provide the uniform biasing magnetic field and to shield the chip from the influence of stray external magnetic fields.

In accordance with the illustrated preferred embodiment, the present invention provides a shielded magnetic bias housing which includes a pair of cup-like structures of a magnetically permeable material fastened together to provide a substantially completely enclosed shielded housing for a magnetic bubble chip. A flat disc of a magnetically hard material is interiorly affixed to the bottom of each of the cup-like elements. The magnetic discs are magnetized parallel to the normal to the surface of the discs to provide a bias magnetic field in the gap between the discs.

To magnetize the discs, the permeable housing structure including the magnetic discs is subjected to a strong external magnetic field which saturates the magnetization of the permeable housing and strongly magnetizes the magnetic discs to a value greater than the ultimate value desired for the bias magnetic field. The housing and magnetic discs are then subjected to a second external field in a direction opposite that of the first applied field which saturates the housing in the opposite direction and reduces the magnetization of the magnetic discs to a precise value desired for the bias field. It has been found that for various choices of magnetic materials, the final value of the bias field varies linearly with the strength of the latter applied magnetic field over a wide range of values of the applied field. Thus if the bias field is pre-adjusted in accordance with the abovedescribed method, a precise and reproducible value of bias field may be obtained without the use of additional trimming screws or other mechanical devices in the housing to shunt magnetic flux or vary the distance between the discs.

FIG. 3 is a graph of the magnitudes of several magnetic fields used to magnetically bias the housing.

DETAILED DESCRIPTION OF THE INVENTION

Figure 1:
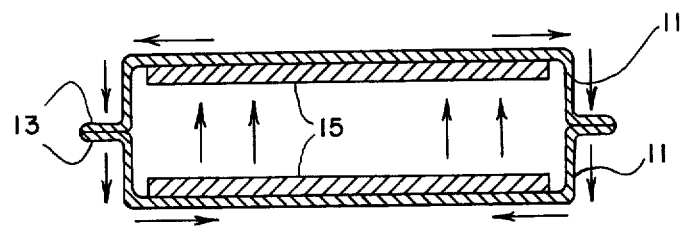
FIG. 1 illustrates a cross-sectional view of a housing for magnetic bubble devices.

In FIG. 1 there is shown a housing structure for magnetic bubble chips including two identical cup-like structures 11. Cups 11 are fabricated from magnetically permeable materials such as Mu-metal or permeable ferrites. In the illustrated embodiment, each of the sections 11 is a cylindrical section including a flange 13. The two sections may thus be welded together along adjacent edges of flanges 13 to form a completely enclosed structure, with the exception of a pair of access slots which will be described further below. Although the housing is here illustrated as being essentially cylindrical and including flanges, other configurations such as a simple rectangular container may also be used to provide a substantially completely shielded enclosure. After the housing has been formed and all machining operations completed, the pieces 11 should be annealed to provide maximum permeability.

On the interior of the bottom of each of the sections 11 there is affixed a thin disc 15 of a magnetically hard material such as barium ferrite, alnico, or a rare earth cobalt compound. Although discs are illustrated in the preferred embodiment, other magnetic pieces of varying shape may also be suitable. Magnetic discs 15 may also be fabricated from synthetic magnetic materials such as barium ferrite loaded plastic "rubber magnets." In structures which have been built, discs of radius 0.375 inch and thickness 0.024 inch have been used in housings which provide a gap between the discs of about 0.270 inch. Magnetic discs 15 may be magnetized to produce a bias magnetic field in the gap between them, as indicated by the arrows in FIG. 1. Permeable cups 11 provide a suitable path to complete the magnetic circuit, again as indicated in FIG. 1.

Figure 2A:
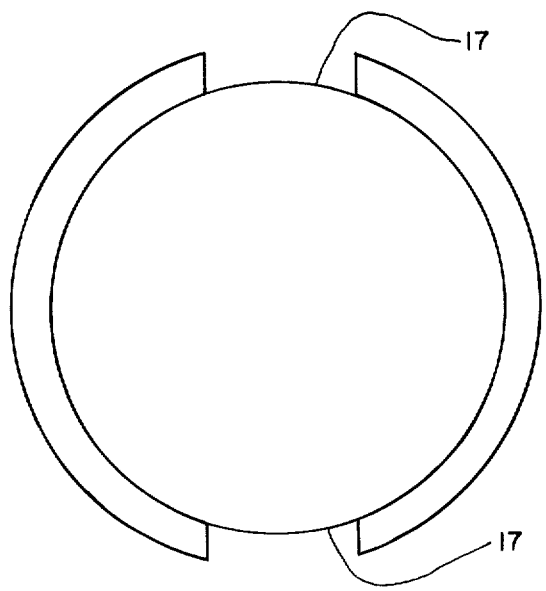
FIGS 2a and 2b show top and side views respectively of the housing.
Figure 2B:
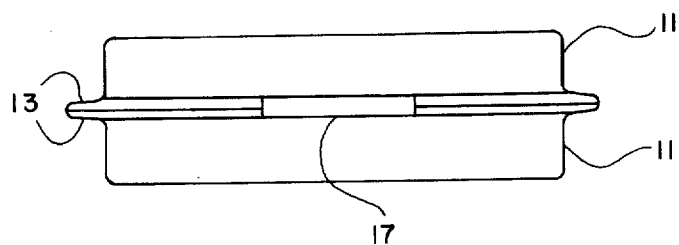

FIGS. 2A and 2B illustrate top and front views respectively of a preferred embodiment of the invention including two slots 17 which provide access for a probe which may be used to measure the magnetic field strength within the enclosure, and also for electrical connections to a magnetic bubble device enclosed within the housing. It is possible to provide electrical access ports other than slots if sufficient access to the interior can be had thereby. In the illustrated preferred embodiment, access slots about 1/16 inch high with an angular width of about 60° have been found not to degrade the shielding provided by a housing of radius about 0.4 inch. Housing structures in accordance with the invention will provide substantially complete shielding of an enclosed magnetic bubble chip from the influence of external magnetic fields. Since the operation of bubble memories requires that a rotating magnetic field be applied to each chip to circulate the magnetic bubbles, there will ordinarily be included within the housing a set of coils to provide the required rotating magnetic field for the enclosed chip. The housing structure of the invention also serves to isolate the rotating field so that it will not affect other chips in the memory, or influence electronic circuits in its vicinity.

It may be seen from FIGS. 1 and 2 that the housing does not include any mechanical mechanisms for adjusting the strength of the bias field provided by discs 15. Such mechanisms are unnecessary if the bias field is established in accordance with the procedure described below. To establish the bias magnetic field, the two sections 11 including magnetic discs 15 are brought together and placed between the poles of an electromagnet which is capable of producing an electromagnetic field strong enough to magnetize discs 15 sufficiently that a magnetic field produced by discs 15 in the gap between them would be of magnitude greater than that desired for the ultimate bias field; e.g. an external field strength greater than about 10,000 oersteds is usually sufficient. It is preferable to saturate the magnetization of the discs so that they are completely and uniformly magnetized. The field direction should be perpendicular to the faces of magnetic discs 15 to magnetically saturate permeable housing 11 and magnetize both discs 15 in a direction perpendicular to the disc faces. A second external magnetic field is then applied to the housing in a direction opposite that of the first field. This latter field will both saturate housing 11 and reduce the magnetization of discs 15 to some level below saturation. Thus, the magnitude of the bias field produced by discs 15 may be adjusted by adjusting the strength of the second applied field. It has been found that for some materials such as Plastiform, manufactured by the 3M Company, Minneapolis, Minnesota, the resulting bias magnetic field in the gap between disc 15 is a linear function of this latter applied magnetic field strength. Thus, once a desired bias field strength is known, it may be simply and precisely obtained by applying a second magnetic field whose strength is determined from a graph such as that of FIG. 3 which illustrates the above mentioned linear relation. Using a procedure such as described here, bias field strengths have been adjusted to within ±1 oersted with good repeatability from unit to unit. Thus, no other mechanical devices for trimming the bias field are required.

I claim:

1. A method for providing a desired d.c. magnetic bias field within a housing for magnetic bubble chips comprising the steps of:

mounting a pair of magnetic elements within the housing with a gap therebetween;

applying a first external magnetic field to said housing in a direction desired as the direction of said bias field, the magnitude of said first external magnetic field being sufficient to magnetize said magnetic elements so that a magnetic field produced by them in the gap therebetween is of a magnitude greater than that of the desired d.c. magnetic bias field; and applying a second external magnetic field to said housing in a direction opposite that of said first magnetic field, the magnitude of said second external field being sufficient to reduce the magnetization of said magnetic elements so that a magnetic field produced by them in the gap therebetween is of the magnitude of the desired d.c. magnetic bias field and simultaneously magnetically saturating said housing.

* * * * *